United States Patent [19]

Wakatabe et al.

[11] Patent Number: 5,262,669
[45] Date of Patent: Nov. 16, 1993

[54] SEMICONDUCTOR RECTIFIER HAVING HIGH BREAKDOWN VOLTAGE AND HIGH SPEED OPERATION

[75] Inventors: Masaru Wakatabe; Mitsugu Tanaka; Shinji Kunori, all of Saitama, Japan

[73] Assignee: Shindengen Electric Manufacturing Co., Ltd., Tokyo, Japan

[21] Appl. No.: 870,268

[22] Filed: Apr. 17, 1992

[30] Foreign Application Priority Data

Apr. 19, 1991 [JP] Japan .................. 3-115341
Sep. 12, 1991 [JP] Japan .................. 3-261132

[51] Int. Cl.$^5$ ............................................. H01L 29/48
[52] U.S. Cl. .................... 257/483; 257/622; 257/916; 257/484; 257/623
[58] Field of Search ............ 257/916, 476, 483, 484, 257/471, 653, 654, 622, 623, 624

[56] References Cited

U.S. PATENT DOCUMENTS

| | | | |
|---|---|---|---|
| 4,641,174 | 2/1987 | Baliga | 357/58 |
| 4,646,115 | 2/1987 | Shannon et al. | 257/484 |
| 4,862,229 | 8/1989 | Mundy et al. | 257/484 |
| 4,982,260 | 1/1991 | Chang et al. | 257/476 X |
| 5,017,976 | 5/1991 | Sugita | 257/484 X |

FOREIGN PATENT DOCUMENTS

| | | |
|---|---|---|
| 59-35183 | 8/1984 | Japan . |
| 2-151067 | 6/1990 | Japan . |
| 3-105975 | 5/1991 | Japan . |

*Primary Examiner*—William Mintel
*Attorney, Agent, or Firm*—Finnegan, Henderson, Farabow, Garrett & Dunner

[57] ABSTRACT

A semiconductor rectifier having a high breakdown voltage and a high speed operation is provided, which includes a semiconductor substrate having an N$^+$-type semiconductor layer and an N-type semiconductor layer, a P$^+$-type semiconductor layer formed in the N-type semiconductor layer to provide a PN junction therebetween, the P$^+$-type semiconductor layer defining exposed regions of the N-type semiconductor layer, and a metal layer provided on an entire surface of the semiconductor substrate having the P$^+$-type semiconductor layer to provide contact surfaces of Schottky barrier between the metal layer and each of the exposed regions of the N-type semiconductor layer. In the structure, a configuration of the PN junction is provided to satisfy conditions given by $0° < \theta \leq 135°$ and $3W_{bi} \leq W \leq 2W_B$ where $\theta$ is an angle between one of the contact surfaces and a tangent line passing through a point f on the PN junction through which a straight line passes from a top of a built-in depletion layer in parallel with each of the contact surfaces and where $W_{bi}$ is a thickness of the built-in depletion layer extending to the N-type semiconductor layer at zero bias voltage, W is a width of each of the contact surfaces and $W_B$ is a thickness of a depletion layer at breakdown of the pn junction, respectively.

20 Claims, 8 Drawing Sheets

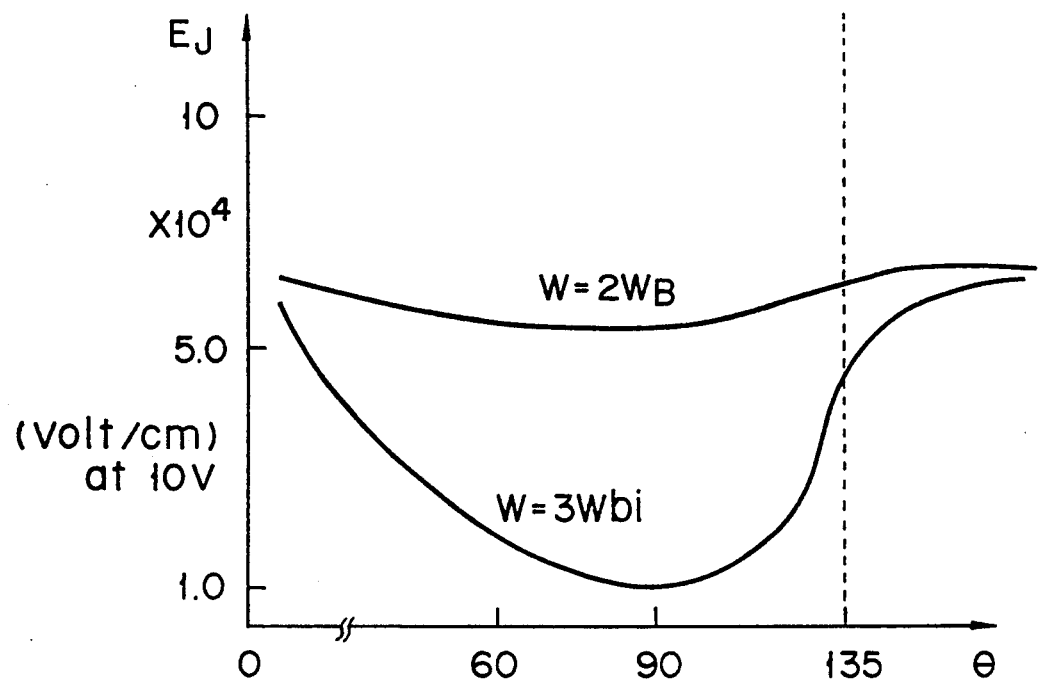
F I G. 5
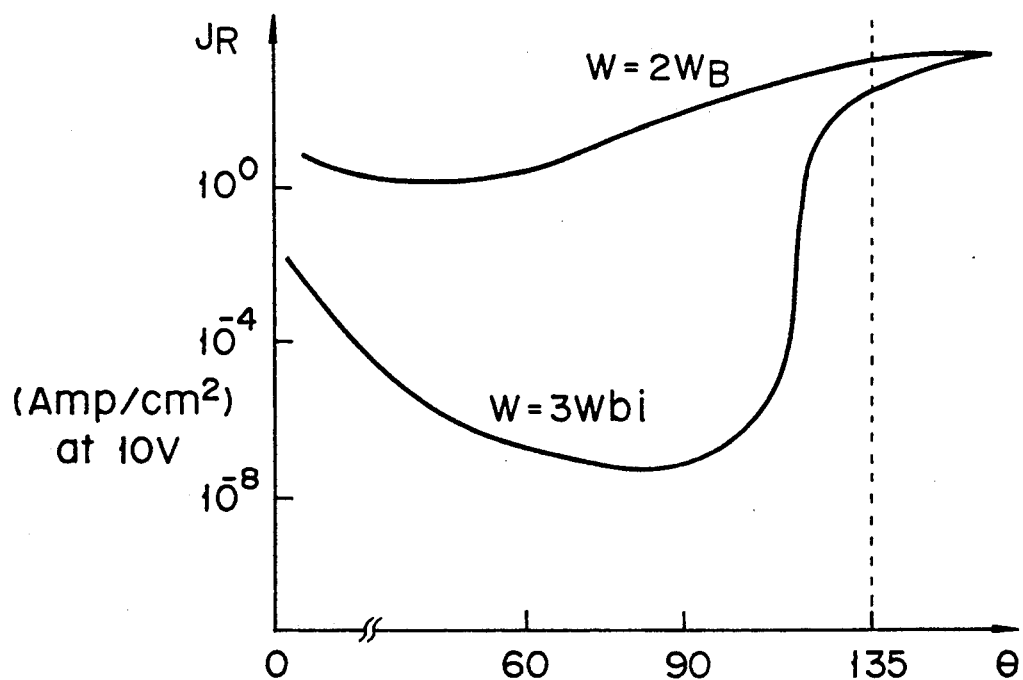
F I G. 6

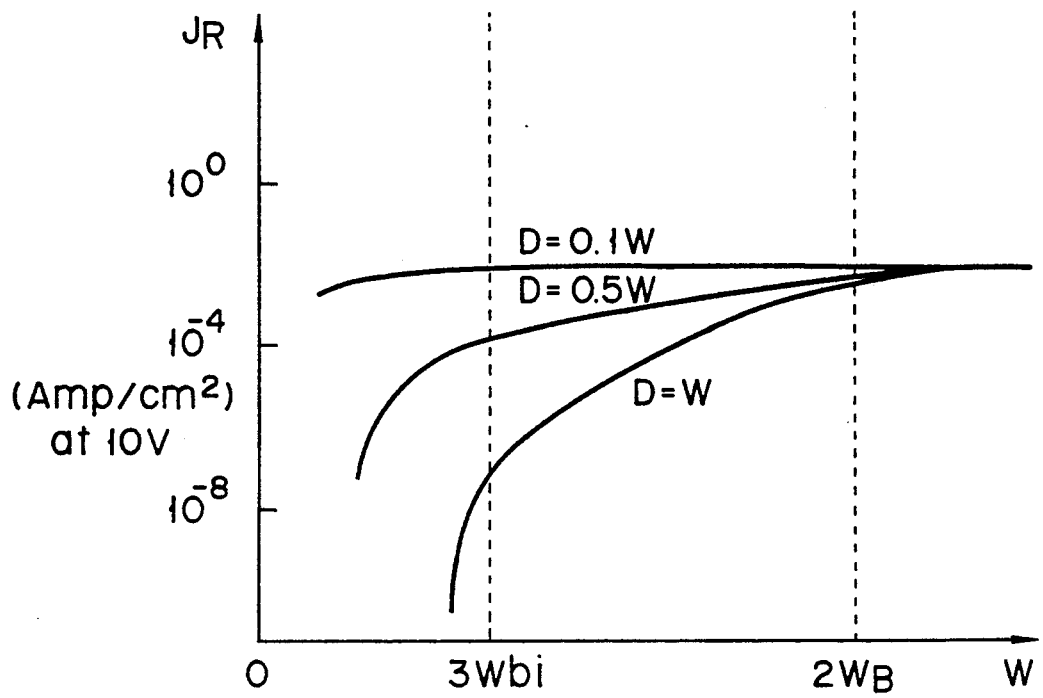
F I G. 7
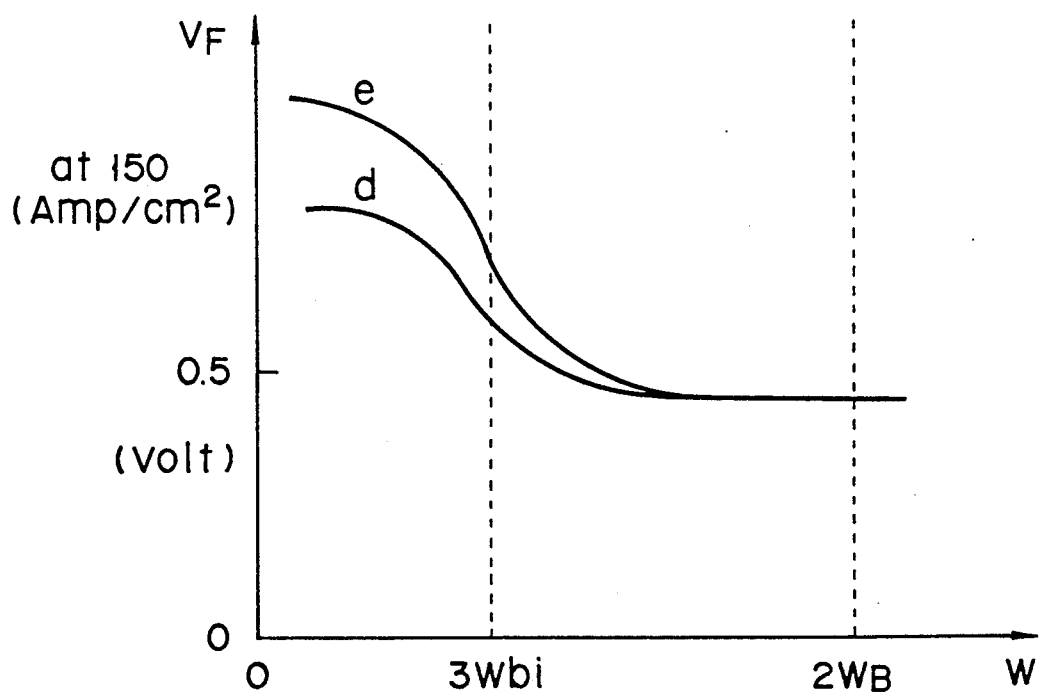
F I G. 8

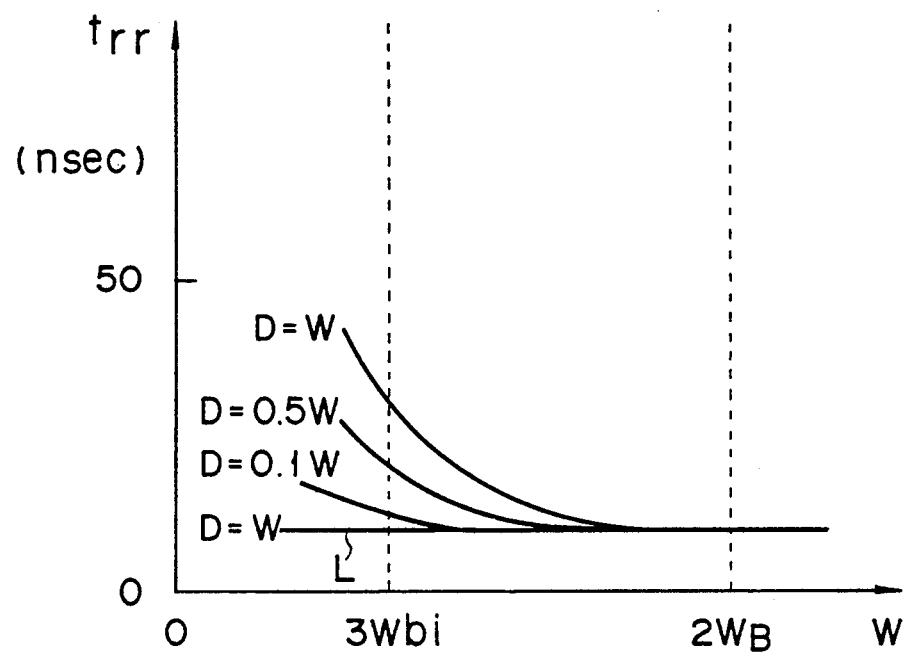
F I G. 9
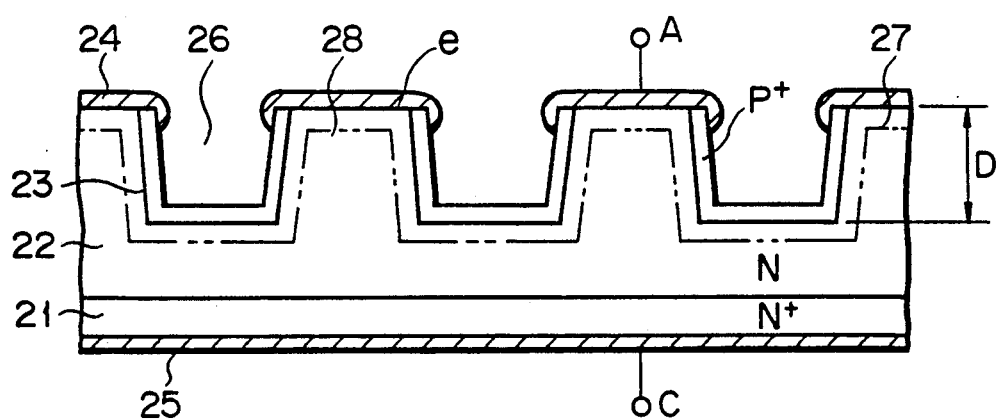
F I G. 10

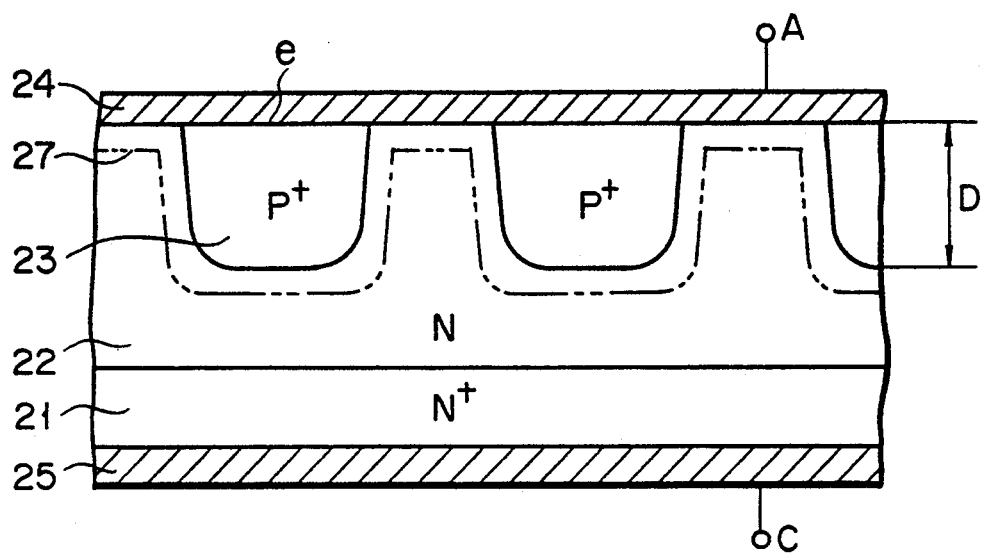
F I G. 11
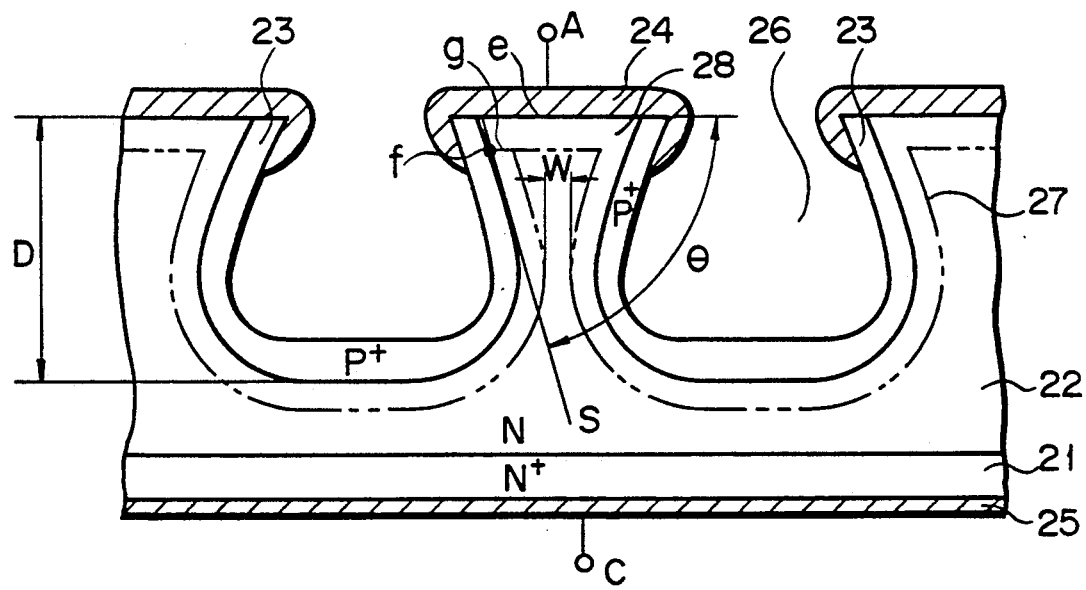
F I G. 12

SEMICONDUCTOR RECTIFIER HAVING HIGH BREAKDOWN VOLTAGE AND HIGH SPEED OPERATION

BACKGROUND OF THE INVENTION

1. Field of the Invention

This invention relates to a semiconductor device, and more particularly to a semiconductor rectifier having high breakdown voltage, low loss and high speed characteristics.

2. Description of the Related Art

Various types of semiconductor devices have been proposed for improving the characteristics of semiconductor rectifiers, etc, especially the switching speed, and the forward and reverse characteristics.

FIG. 1 is a sectional view of a conventional Schottky barrier semiconductor device. Numeral 11 indicates one conductivity type semiconductor substrate having a high impurity concentration such as an N+-type semiconductor substrate; 12 an N-type semiconductor layer; 13 a guard ring region of a P-type semiconductor layer; 14 an insulting film such as $SiO_2$; 15 a metal electrode making Schottky barrier contact with the N-type semiconductor layer 12; 16 an ohmic metal electrode provided on the N+-type semiconductor substrate 11; A an anode; and C a cathode, respectively.

The Schottky barrier semiconductor device of FIG. 1 is well known for increasing the breakdown voltage. However, such a device has an insufficient efficiency because the reverse leakage current is high in the rectifying operation.

SUMMARY OF THE INVENTION

Accordingly, an object of the present invention is to provide a semiconductor rectifier having a high breakdown voltage and a high speed operation.

Another object of the present invention is to provide a semiconductor rectifier having a low forward voltage drop and a low reverse leakage current.

A further object of the present invention is to provide a semiconductor rectifier having a short reverse recovery time.

A still further object of the present invention is to provide a semiconductor rectifier having a high forward current effective area ratio $\alpha$.

According to one aspect of the present invention, there is provided a semiconductor rectifier which includes a semiconductor substrate having a firs semiconductor layer of one conductivity type and a second semiconductor layer of one conductivity type provided on the first semiconductor layer, a third semiconductor layer of an opposite conductivity type formed in the second semiconductor layer to provide a pn junction therebetween, the third semiconductor layer defining exposed regions of the second semiconductor layer, a metal layer provided on an entire surface of the semiconductor substrate having the third semiconductor layer to provide contact surfaces of Schottky barrier between the metal layer and each of the exposed regions of the second semiconductor layer, and a configuration of the pn junction being provided to satisfy conditions given by $0° < \theta \leq 135°$ and $3W_{bi} \leq W \leq 2W_B$ where $\theta$ is an angle between one of the contact surfaces and a tangent line s passing through a point f on the pn junction through which a straight line g passes from a top of a built-in depletion layer in parallel with each of the contact surfaces and where $W_{bi}$ is a thickness of the built-in depletion layer extending to the second semiconductor layer at zero bias voltage, W is a width of each of the contact surfaces and WB is a thickness of a depletion layer at breakdown of the pn junction, respectively.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 5 shows a $\theta-E_J$ (angle-electric field strength) characteristic of the rectifier;

FIG. 6 shows a $\theta-J_R$ (angle-reverse leakage current) characteristic of the rectifier;

FIG. 7 shows a $W-J_R$ (width of contact surface-reverse leakage current) characteristic of the rectifier;

FIG. 8 shows a $W-V_F$ (width of contact surface-forward voltage drop) characteristic of the rectifier;

FIG. 9 shows a $W-t_{rr}$ (width of contact surface-reverse recovery time) characteristic of the rectifier;

FIG. 10 is a sectional view showing a part of a Schottky electrode of a rectifier according to the first embodiment of the present invention;

FIG. 11 is a sectional view showing a modification of the rectifier according to the first embodiment of the present invention;

FIG. 12 is a sectional view showing a part of a rectifier according to a second embodiment of the present invention.

DETAILED DESCRIPTION OF THE PREFERRED EMBODIMENTS

Referring to the accompanying drawings, embodiments of the present invention will be described.

Figure 2:
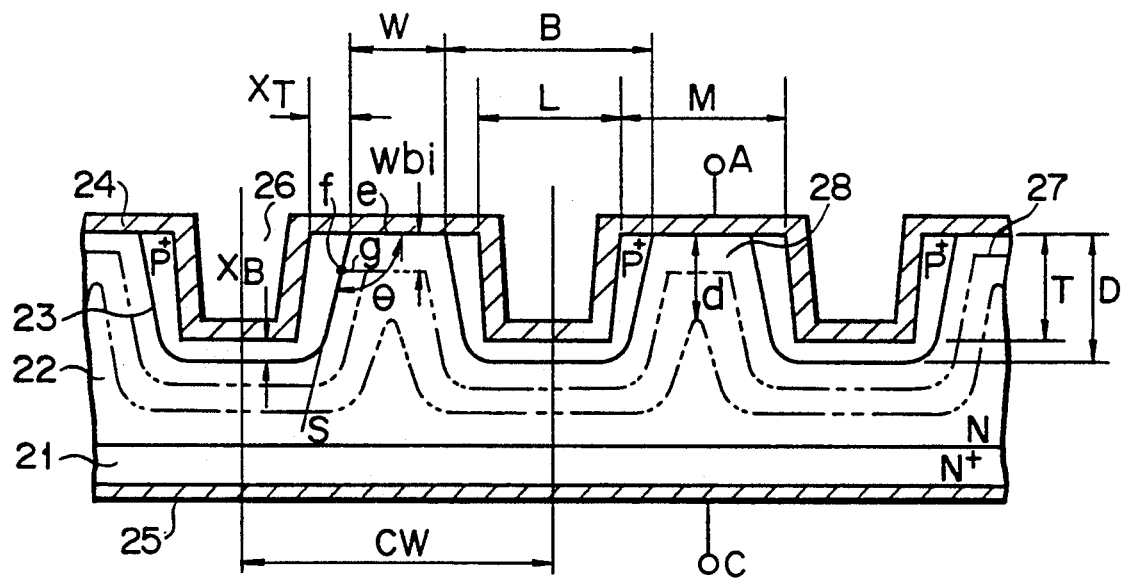
FIG. 2 is a sectional view showing a part of a rectifier according to a first embodiment of the present invention.

FIG. 2 is a sectional view of a part of a rectifier according to a first embodiment of the present invention.

Figure 3A:
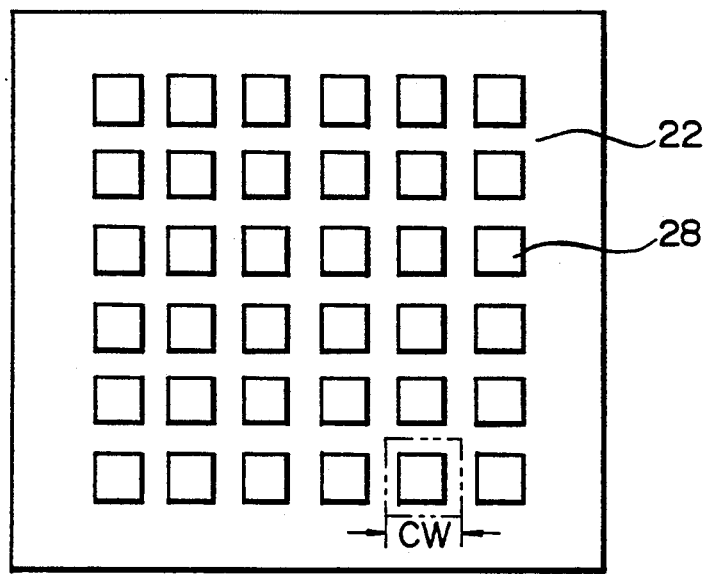
FIG. 3A is a plan view of the rectifier including a plurality of unit cells shown in FIG. 2.

In FIGS. 2 and 3A, numeral 21 indicates an N+-type semiconductor substrate; 22 an N-type semiconductor layer; 23 a P+-type semiconductor layer; 24 a metal electrode forming a Schottky barrier; 25 an ohmic electrode; 26 a groove formed in the N-type semiconductor layer 22; W a width of a contact surface e at which the metal electrode 24 is in Schottky barrier contact with exposed surface of projected portions of the N-type semiconductor layer 22; $W_{bi}$ a thickness of a built-in depletion layer 27 extending from the contact surface e at a zero bias; and $\theta$ an angle between the contact surface e or the surface of the N-type semiconductor layer 22 and a tangent line s passing through a point f on the pn junction. In this case, the point f on the pn junction is given by an intersection between the pn junction and a line g passing from a top of the built-in depletion layer 27 and extending in parallel with the contact surface e or the exposed surface of the N-type semiconductor layer 22. D is a distance between the contact surface e and a bottom of the P+-type semiconductor layer 23 in the groove 26. A width of a depletion layer at the breakdown of the N-type semiconductor layer 22 is represented by $W_B$.

The most important conditions for the structure of the present invention is that $\theta$ is in the range of $0° < \theta \leq 135°$ and that a relation among $W_{bi}$, W and $W_B$ is given by $3W_{bi} \leq W \leq 2W_B$.

By fulfilling a condition of $D \geq 0.5W$ in addition to the conditions of $0° < \theta \leq 135°$ and $3W_{bi} \leq W \leq 2W_B$, more improved electrical characteristics can be achieved.

Figure 3B:
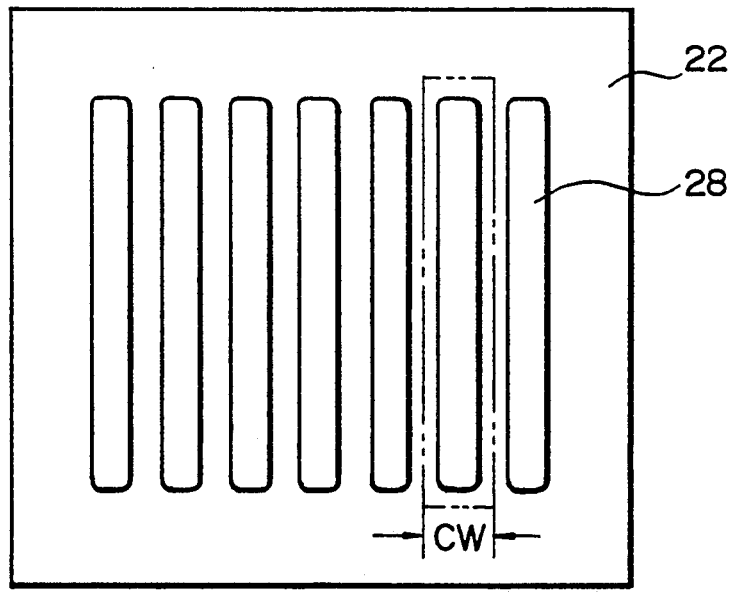
FIG. 3B is a plan view of the rectifier including a plurality of unit cells shown in FIG. 2.

Although each projected portion 28 of the N-type semiconductor layer 22 formed by grooves 26 is square as shown in FIG. 3A, it may be provided by a stripe-shaped structure as shown in FIG. 3B.

The embodiment of FIG. 2 will be described in detail. An N-type epitaxial silicon layer 22 having a resistivity of 5 Ω·cm and a thickness of 14 μm is grown on an N+-type silicon substrate 21 having a resistivity of 0.003 Ω·cm and a thickness of 400 μm. After an SiO₂ film is formed on the epitaxial silicon layer, a P-type guard ring (not shown) is provided. Windows are formed in the SiO₂ film by lithography techniques to provide an SiO₂ mask. Thereafter, a plurality of grooves 26 are formed in the silicon layer 22 surrounded by the guard ring, using a reactive ion etching apparatus. A boron layer is deposited on a side wall and a bottom of each groove 26 of the silicon layer 22 by BN (boron nitride) deposition techniques. After carrying out a diffusion process, a P+-type semiconductor layer 23 is provided in the side wall and the bottom of the groove 26 except an upper surface of each projected portion 28. After the SiO₂ film is removed from the projected portion 28, a titanium (Ti) layer 24 is deposited over the entire surface of the exposed silicon layer 22. The nickel (Ni) layer 25 is provided on the semiconductor substrate 21 as an ohmic electrode. Thereafter, the semiconductor substrate is divided into chips having a size of 1.6 × 1.6 mm to provide rectifiers.

In this case, a deposited layer containing a P-type impurity having a required concentration may be used in place of the boron layer. The deposited layer may be provided in the form of an epitaxial semiconductor layer, or formed by depositing a polycrystal semiconductor, using CVD techniques.

The following indicates the practical values of the structure shown in the FIG. 2.

$\theta$: approximately 110°; W: 3.5 μm; D: 3.0 μm; L (the opening width of groove 26): 2.0 μm; T (the depth of groove 26): 2.0 μm; M (the upper width of the projected portion 28): 6.0 μm; B (the width of P+-type semiconductor layer 23): 4.4 μm; XB (the bottom thickness of P+-type semiconductor layer 23): 1.0 μm; XT (the upper width of P+-type semiconductor layer 23): 1.2 μm; and CW (the size of each cell): 8.0 μm × 8.0 μm.

According to the invention as described above, the main junction is provided between the N-type semiconductor layer 22 and the metal electrode 24. That is, the main junction having the Schottky barrier and the relatively large width of W is provided.

Figure 4A:
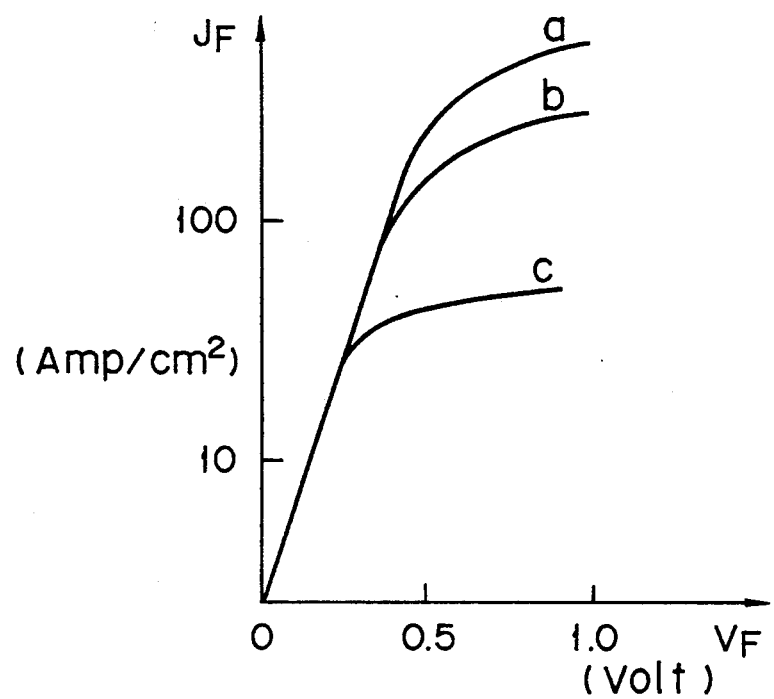
FIG. 4A shows a $V_F-J_F$ (forward voltage drop-forward current) characteristic of the rectifier.
Figure 4B:
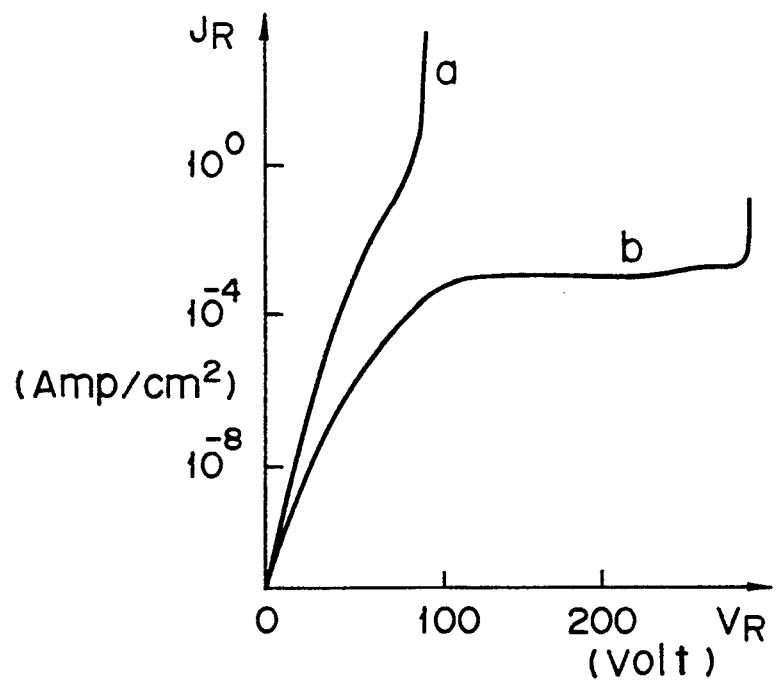
FIG. 4B shows a $V_R-J_R$ (reverse voltage-reverse leakage current) characteristic of the rectifier.

The forward and reverse characteristics of such a rectifier are shown by curve b of the $V_F - J_F$ (forward voltage drop-forward current) characteristic in FIG. 4A and of the $V_R - J_R$ (reverse voltage-reverse leakage current) characteristic in FIG. 4B, respectively.

For comparison's sake, the forward and reverse characteristics of a conventional Schottky barrier rectifier are represented by curve a of the FIG. 4A and FIG. 4B, respectively. As is apparent from those figures, the rectifier of the present invention decreases the reverse leakage current remarkably. The characteristics of the ohmic contact and the Schottky barrier between the metal electrode 24 and the P+-type semiconductor layer 23 are indicated by curve b and curve c, respectively.

In FIG. 2, the depletion layer 27 extending from the Schottky barrier formed between the N-type semiconductor 22 and the metal electrode 24 at the reverse bias is located so as to be sandwiched between depletion layers from the pn junction of the P+-type semiconductor layer 23. Therefore, when a certain reverse voltage is applied to the rectifier, these depletion layers are joined at a depth of d from the contact surface e, thereby reducing the electric field strength $E_J$, which is given when a voltage V is applied to the contact surface e of the Schottky barrier, to $E_J = V/d$. That is, the electric field strength $E_J$ will be reduced as the depth d of the joined depletion layer is increased.

The relation between the angle $\theta$ and the electric field strength $E_J$ of the Schottky barrier provided between the N-type semiconductor layer 22 and the metal electrode 24 is shown in the $\theta - E_J$ (angle-electric field strength) characteristic of FIG. 5. The relation between the angle $\theta$ and the reverse leakage current $J_R$ of the Schottky barrier is shown in the $\theta - J_R$ (angle-reverse leakage current) characteristic of FIG. 6. Both figures show the curves under conditions of $W = 2W_B$ and $W = 3W_{bi}$, representing a preferable range of W in practical use.

It is apparent from FIG. 5 that the maximum electric field relaxation effect is provided when the angle $\theta$ is approximately 90°. Specifically, the electric field strength $E_J$ is reduced to a minimum value at approximately 90°, below or above which $E_J$ has larger values. When the angle $\theta$ exceeds 135°, the electric field strength $E_J$ approaches that of the conventional Schottky barrier semiconductor device.

Since the reverse leakage current $J_R$ of FIG. 6 depends on electric field strength $E_J$, it presents almost the similar tendency to that of FIG. 5.

In contrast, the relations between the width W of contact surface e in the N-type semiconductor layer 22 exposed to the substrate surface and the reverse leakage current $J_R$ and between the width W and the forward voltage $V_F$, are shown in the $W - J_R$ characteristic of FIG. 7 and the $W - J_F$ characteristic of FIG. 8, respectively.

FIG. 7 shows $J_R$ and the depth D of the P+-type semiconductor layer 23 from the contact surface e (Schottky contact surface) when the angle $\theta$ is 90° and a reverse voltage of 10 V is applied. As is evident from the figure, $J_R$ tends to decrease in the regions: $D \geq 0.5W$ and $W \leq 2W_B$. FIG. 8 depicts the relation between the width W and the forward voltage drop $V_F$ at a forward current $J_F$ of 150 amp/cm². Therefore, $3W_{bi} \leq W \leq 2W_B$ is a preferable range to render low $V_F$. In this case, when the contact between the metal electrode 24 and the P+-type semiconductor layer 23 are provided by the ohmic contact or the Schottky barrier, the characteristic is given by a curve d or a curve e.

FIG. 9 illustrates the $W-t_{rr}$ (the width of the contact surface-reverse recovery time) switching characteristic.

In FIG. 9, the reverse recovery time $t_{rr}$ is remarkably increased as the width W becomes smaller than $3W_{bi}$, presenting almost the similar tendency to the $W-V_F$ characteristic of FIG. 8.

At the interface between the P+-type semiconductor layer 23 and the metal electrode 24, when the surface concentration of the P+-type semiconductor layer 23 becomes below $5 \times 10^{18}$ atoms/cm$^3$, a Schottky contact may be provided. When the interfaces between 23 to 24 and between 22 to 24 provide the Schottky barrier as described above, $t_{rr}$ may not be increased even in the region of $W \leq 3W_{bi}$ as shown by line L in FIG. 9, which differs from the case of the ohmic contact between 23 to 24 and the Schottky barrier between 22 to 24.

In the high current region, however, $V_F$ becomes large as shown by curve c of the $V_F-J_F$ characteristic in FIG. 4A and by curve e of the $W-V_F$ characteristic in FIG. 8, because the series resistance is not modulated with the minority carrier and is kept at the high resistance value.

Further, in FIG. 2, the metal electrode 24 is provided on the entire surface of the exposed N-type semiconductor layer 22 including the P+-type semiconductor layer 23 formed in the side wall and the bottom of each groove 26. However, it is not always necessary to provide the metal electrode 24 on the entire surface of the exposed P+-type semiconductor layer 23 so long as the P+-type semiconductor layer 23 is formed in the side wall and the bottom of each groove 26. The metal electrode 24 may be electrically connected to the P+-type semiconductor layer 23 as shown in FIG. 10.

FIG. 11 illustrates a modified structure of the FIG. 2, which is provided by diffusing a P-type impurity into the N-type semiconductor layer 22 without forming grooves 26 therein.

In the example, $W_{bi}$, W, and $W_B$ are set so as to satisfy the condition of $3W_{bi} \leq W \leq 2W_B$, as described above.

Figure 1:
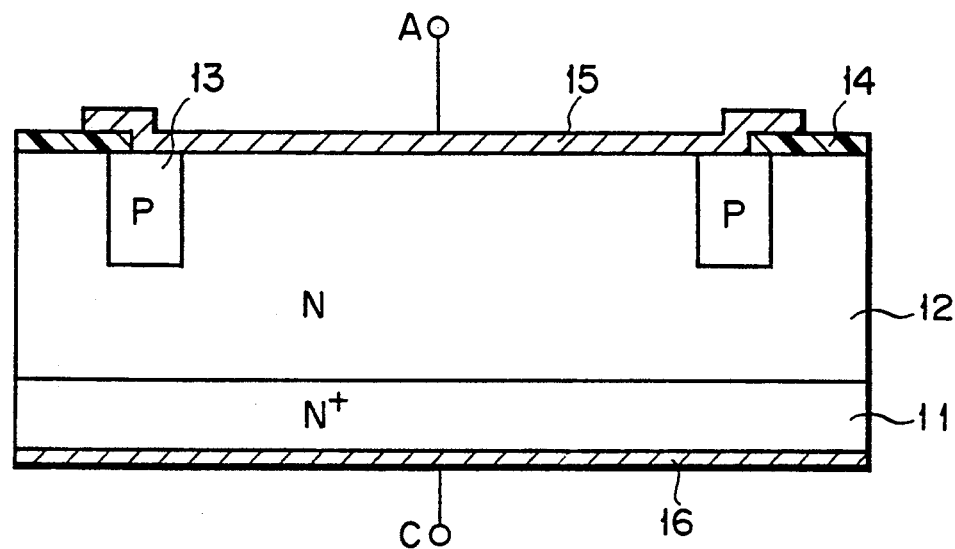
FIG. 1 is a sectional view of a conventional rectifier.

A second embodiment of the present invention will be explained. The embodiment has the condition of $3W_{bi} \leq W \leq 2W_B$ in the same manner as the first embodiment to provide a structure adapted to an acute angle of $\theta$. The same parts as those in FIG. 1 are indicated by the same reference characters.

FIG. 12 illustrates a semiconductor rectifier which include projected portions 28 formed by grooves 26 in the N-type semiconductor layer 22 so that each projected portion has a constricted or narrow configuration at the root. The angle $\theta$ is given by an acute angle, for example, 70°. In this case, the angle $\theta$ is an angle between the contact surface e and the tangent line s passing through the point f on the pn junction.

For producing the grooves 26 having the configuration, the N-type semiconductor layer 22 is etched by RIE (Reactive Ion Etching) techniques, using etching gases for isotropic etching, anisotropic etching, or combination etching, such as $SF_6$, $CCl_2F_2$, $CHF_3$, $HB_r$, etc. Thereafter, boron is diffused into the inner walls of the grooves 26 to provide the P+-type semiconductor layer 23 therein. The metal electrode 24 is provided so as to be connected to the P+-type semiconductor layer 23 at the contact surface e. Unlike the first embodiment shown in FIG. 2, since opposing portions of the P+-type semiconductor layer 23 are located inside the contact surface e, the width W is determined by the nearest distance between opposing portions of the P+-type semiconductor layer 23 or between opposing portions of the pn junction.

A third embodiment of the present invention will be described.

Figure 13:
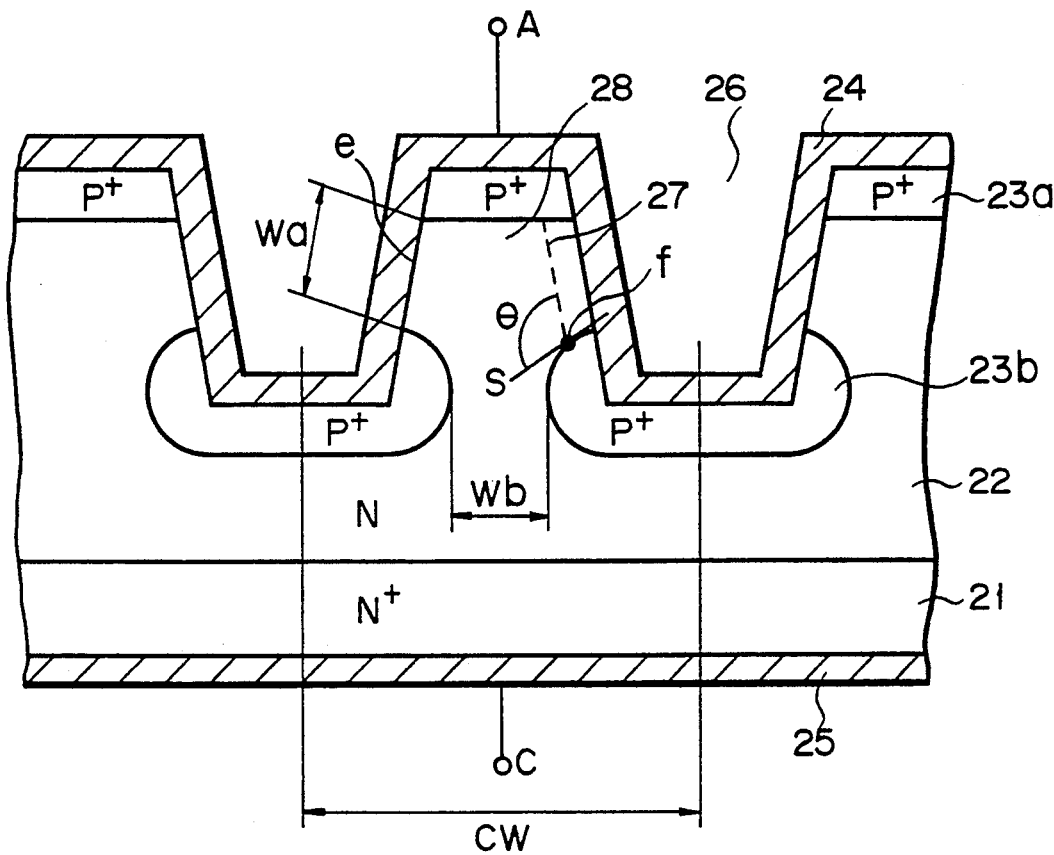
FIG. 13 is a sectional view showing a part of a rectifier according to a third embodiment of the present invention.

FIG. 13 shows a structure of a semiconductor rectifier in which a forward current effective area ratio $\alpha$ [($\alpha$ = (the width of contact surface e)/(the width of unit cell)] is increased to reduce the size. The same parts as those in FIG. 2 are indicated by the same reference characters.

In the figure, numeral 23a indicates a first p+-type semiconductor region that is provided on the upper surface of the projected portion 28 formed by grooves 26 in the N-type semiconductor layer 22; and 23b represents a second P+-type semiconductor region formed in the bottom and a part of side walls of the grooves 26. The metal electrode 24 is provided on the exposed N-type semiconductor layer 22 including the first region 23a and the second region 23b to form a contact surface e having the Schottky barrier or ohmic contact.

In the structure, Wa is a distance between the first region 23a and the second region 23b; $W_b$ is the nearest distance between adjacent second regions 23b; $W_{bi}$ is the thickness of the built-in depletion layer extending from the contact surface e at a zero bias; $W_B$ the thickness of the depletion layer at breakdown; and $\theta$ is the angle between the contact surface e and the tangent line s passing through the point f of $W_{bi}$ in the second region 23b. When the contact surface e is provided by the ohmic contact, the conditions of $2W_{bi} > W_a$, $W_b$ and $60° \leq \theta \leq 180°$ are preferably given. On the contrary, when the contact surface e is provided by the Schottky barrier, the conditions of $W_a$, $W_b \leq 2W_B$ and $60° \leq \theta \leq 180°$ are given.

Further, when the contact surface e has the ohmic contact under the conditions such that one of $W_a$ and $W_b$ is smaller than $2W_{bi}$ and the other is between $2W_{bi}$ and $2W_B$, the rectifier shows the electrical characteristics corresponding to the height of the electron potential in the N-type semiconductor layer 22, depending upon the configuration of the first and second regions 23a and 23b. Consequently, the forward and reverse rectifying characteristics can be obtained in the same manner as the contact surface e is provided by the Schottky barrier.

The forward current effective area ratio $\alpha$ is given by $2W_a/CW$. That is, since the contact surface e is provided at the side wall of each projected portion 28, the width of the cell size CW can be reduced according to the configuration of the groove 26. Therefore, the ratio $\alpha$ can be increased by 2 to 4 times that of the conventional rectifier.

It is possible to increase the contact surface e or the effective area of the cell without reducing the suppressing effect of reverse leakage current. For the same forward current, the current density at the contact surface e can be reduced. Further, when the contact surface e is provided by the Schottky barrier, the forward voltage drop can be decreased. Since the size of the rectifier can be reduced without lowering the current density, it can be possible to produce semiconductor devices in low cost.

It is further understood by those skilled in the art that the foregoing description is only of the preferred embodiments and that various changes and modifications may be made in the invention without departing from the spirit and scope thereof.

What is claimed is:

1. A semiconductor rectifier comprising:
   a semiconductor substrate including a first semiconductor layer of one conductivity type and a second semiconductor layer of the one conductivity type provided on said first semiconductor layer;
   a plurality of third semiconductor layers of an opposite conductivity type formed in said second semiconductor layer to provide pn junctions therebetween, said plurality of third semiconductor layers defining exposed regions of said second semiconductor layer;
   a metal layer provided over an entire surface of said semiconductor substrate including said plurality of third semiconductor layers to provide Schottky barrier contact surfaces between said metal layer and each of said exposed regions of said second semiconductor layer; and
   each of said plurality of third semiconductor layers being provided to satisfy two conditions given by $0° < \theta \leq 135°$ and $3W_{bi} \leq W \leq 2W_B$, where $\theta$ is an angle between one of said contact surfaces and a tangent line passing through a point f on one of said pn junctions through which a straight line passes from a top of a built-in depletion layer in parallel with each of said contact surfaces and where $W_{bi}$ is a thickness of said built-in depletion layer extending to said second semiconductor layer at zero bias voltage, W is a width of each of said contact surfaces and $W_B$ is a thickness of a depletion layer at breakdown of each of said pn junctions, respectively.

2. The semiconductor rectifier according to claim 1, wherein a relation between a depth D and said width W is given by $D \geq 0.5W$, where said D is rendered by a distance between each of said contact surfaces and a bottom of each of said plurality of third semiconductor layers.

3. The semiconductor rectifier according to claim 1, wherein said metal layer is in ohmic contact with said plurality of third semiconductor layer.

4. The semiconductor rectifier according to claim 1, wherein said metal layer is in Schottky barrier contact with said plurality of third semiconductor layer.

5. The semiconductor rectifier according to claim 1, wherein said second semiconductor layer is an epitaxial layer having an impurity concentration lower than said first semiconductor layer.

6. The semiconductor rectifier according to claim 1, wherein each of said plurality of third semiconductor layers has an impurity concentration of more than $5 \times 10^{18}$ atoms/cm$^3$.

7. The semiconductor rectifier according to claim 1, wherein each of said exposed regions of said second semiconductor layer is square.

8. The semiconductor rectifier according to claim 1, wherein each of said exposed regions of said second semiconductor layer has a stripe-shaped structure.

9. The semiconductor rectifier according to claim 1, wherein grooves are provided in said second semiconductor layer.

10. The semiconductor rectifier according to claim 9, wherein each of said plurality of third semiconductor layers is formed along each of said grooves except each of said contact surfaces.

11. The semiconductor rectifier according to claim 9, wherein an opening width of each of said grooves is different from a bottom width thereof.

12. The semiconductor rectifier according to claim 10, wherein said metal layer is provided over said second semiconductor layer including said plurality of third semiconductor layers.

13. A semiconductor rectifier comprising:
    a semiconductor substrate including a first semiconductor layer of one conductivity type and a second semiconductor layer of the one conductivity type provided on said first semiconductor layer;
    grooves formed in said second semiconductor layer to provide projected portions thereof;
    a first diffused region of an opposite conductivity type formed in an entire surface of each of said projected portions;
    a second diffused region of an opposite conductivity type formed in a bottom of each of said grooves containing a part of a side surface thereof to define the nearest distance between adjacent second diffused regions; and
    a metal layer provided on an entire surface of said semiconductor substrate having said grooves to provide contact surfaces between said metal layer and each of exposed regions of said second semiconductor layer defined between said first and second diffused regions.

14. The semiconductor rectifier according to claim 13, wherein each of said contact surfaces has a Schottky barrier contact.

15. The semiconductor rectifier according to claim 13, wherein each of said contact surfaces has an ohmic contact.

16. The semiconductor rectifier according to claim 13, wherein an opening width of each of said grooves is larger than a bottom width thereof.

17. The semiconductor rectifier according to claim 13, wherein a configuration of a pn junction between said second semiconductor layer and said second diffused region is provided to satisfy a first condition of $60° \leq \theta \leq 180°$ where $\theta$ is an angle between one of said contact surfaces and a tangent line passing through an intersection f of a built-in depletion layer and said pn junction.

18. The semiconductor rectifier according to claim 17, wherein said first and second diffused regions are provided to satisfy a second condition of $W_a$, $W_b \leq 2W_B$, where $W_a$ is a width of each of said contact surfaces, $W_b$ is said nearest distance and $W_B$ is a thickness of a depletion layer at breakdown of each of said pn junctions.

19. The semiconductor rectifier according to claim 17, wherein said first and second diffused regions are provided to satisfy a third condition of $W_a$, $W_b \leq 2W_{bi}$, where $W_{bi}$ is a thickness of said built-in depletion layer extending to said second semiconductor layer at zero bias voltage.

20. The semiconductor rectifier according to claim 19, wherein one of W and $W_b$ is smaller than $2W_{bi}$, while other of $W_a$ and $W_b$ is between $2W_{bi}$ and $2W_B$.

* * * * *

UNITED STATES PATENT AND TRADEMARK OFFICE
CERTIFICATE OF CORRECTION

PATENT NO. : 5,262,669
DATED : November 16, 1993
INVENTOR(S) : Masaru Wakatabe et al It is certified that error appears in the above-indentified patent and that said Letters Patent is hereby corrected as shown below:

Claim 3, column 7, line 42, change "layer" to --layers--.

Claim 4, column 7, line 45, change "layer" to --layers--.

Claim 18, column 8, line 50, change "$W_a$" to --Wa--.

Claim 18, column 8, line 51, change "$W_b \leq 2W_B$, where $W_a$" to --$Wb \leq 2W_B$, where Wa--.

UNITED STATES PATENT AND TRADEMARK OFFICE
CERTIFICATE OF CORRECTION

PATENT NO. : 5,262,669
DATED : November 16, 1993
INVENTOR(S) : Masaru Wakatabe et al It is certified that error appears in the above-indentified patent and that said Letters Patent is hereby corrected as shown below:

Claim 18, column 8, line 52, change "$W_b$" to --Wb--.

Claim 19, column 8, line 57, change "$W_a$, $W_b$" to --Wa,Wb--.

Claim 20, column 8, line 62, change "$W_b$" to --Wb--.

Col. 8, line 63, claim 20, change "$W_a$ and $W_b$" to --Wa and Wb--.

Signed and Sealed this

Eighteenth Day of October, 1994

Attest:

BRUCE LEHMAN

Attesting Officer

Commissioner of Patents and Trademarks